US008279701B2

(12) United States Patent
Ide

(10) Patent No.: US 8,279,701 B2
(45) Date of Patent: Oct. 2, 2012

(54) SEMICONDUCTOR STORAGE DEVICE AND CONTROL METHODS THEREOF

(75) Inventor: Masao Ide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 214 days.

(21) Appl. No.: 12/732,845

(22) Filed: Mar. 26, 2010

(65) Prior Publication Data

US 2010/0246308 A1  Sep. 30, 2010

(30) Foreign Application Priority Data

Mar. 31, 2009  (JP) .................................. 2009-84178

(51) Int. Cl.
 *G11C 8/00* (2006.01)
(52) U.S. Cl. .......... 365/230.03; 365/230.06; 365/230.08
(58) Field of Classification Search ............ 365/230.03, 365/230.06, 230.08, 189.05, 191, 233
 See application file for complete search history.

(56) References Cited

U.S. PATENT DOCUMENTS

| 6,366,487 | B1 * | 4/2002 | Yeom ............................. 365/52 |
| 6,735,674 | B2 * | 5/2004 | Lee ................................ 711/140 |
| 7,145,812 | B2 * | 12/2006 | Takahashi et al. ....... 365/189.07 |
| 2003/0012072 | A1 * | 1/2003 | Gold et al. ............... 365/230.03 |

FOREIGN PATENT DOCUMENTS

| JP | 11-162165 | 6/1999 |
| JP | 2007-149201 | 6/2007 |

* cited by examiner

*Primary Examiner* — Dang Nguyen
(74) *Attorney, Agent, or Firm* — Staas & Halsey LLP

(57) ABSTRACT

A semiconductor storage device and control method are provided. The semiconductor storage device includes a storage unit including a plurality of storage elements specified by addresses and divided into a plurality of blocks each corresponding to a plurality of the addresses, a write address decoding circuit that decodes a write address specifying a block to write data, a write buffer provided in a write signal path to input write data including write address to the block specified by the write address and a write buffer control unit that disables a write buffer provided in the write signal path for inputting the write data to blocks other than a block including a write address decoded by the write address decoding circuit.

10 Claims, 4 Drawing Sheets

1

SEMICONDUCTOR STORAGE DEVICE AND CONTROL METHODS THEREOF

CROSS-REFERENCE TO RELATED APPLICATION(S)

This application is related to and claims priority to Japanese Patent Application No. 2009-84178 filed on Mar. 31, 2009 in the Japan Patent Office, and incorporated herein by reference.

BACKGROUND

1. Field

The embodiments discussed herein are related to a semiconductor storage device and control methods thereof.

2. Description of the Relate Art

FIG. 1 illustrates a conventional semiconductor storage device. A semiconductor storage device 1 includes a multistage buffer 10, clock control circuits 20-1 to 20-$n$, an address decoding circuit 30 which selects a buffer used for writing and an address decoding circuit 40 which selects a buffer used for reading. The multistage buffer 10 is an n-stage buffer (n is a natural number equal to or greater than 2) including buffers 11-1 to 11-$n$. Each of the buffers 11-1 to 11-$n$ include an m-stage flip-flop (m is a natural number) including flip-flops 12-0 to 12 (m−1). FIG. 1 illustrates, input data 130 to be written to the multistage buffer 10, ODT represents output data to be read from the multistage buffer 10, an address signal 120, and a clock signal 100.

A clock signal 100 is supplied only to a buffer corresponding to a selected address from a corresponding one of the clock signal circuits 20-1 to 20-$n$. Thus, it is possible to operate only a single buffer among the multistage buffer 10. Since no clock signals 100 are supplied to buffers other than the buffer corresponding to the selected address, power consumption of the entire semiconductor storage device 1 can be reduced.

However, an increase in the number of stages n of the multistage buffer 10 leads to an increase in the mounting area of the semiconductor storage device 1 and thus an increase in the data transmission distance. Therefore, it is desired to amplify data by providing transfer buffers in signal lines which transfer data. Since such transfer buffers are provided at designated intervals and at each stage of the multistage buffer 10, an increase in the number of stages n of the multistage buffer 10 results in a significant number of transfer buffers. While FIG. 1 illustrates only some transfer buffers as transfer buffers 15, the actual number of the transfer buffers 15 may vary, e.g., be large.

Therefore, even if an attempt is made to reduce the power consumption of the entire semiconductor storage device 1 by supplying a clock signal 100 only to a buffer in the multistage buffer 10 which corresponds to a selected address, the individual transfer buffers 15 keep operating, and thus the amount of reduction of power consumption may be limited.

SUMMARY

It is an aspect of the embodiments discussed herein to provide a semiconductor storage device and a control method.

The above aspects can be attained by a semiconductor storage device that includes a storage unit including a plurality of storage elements specified by addresses and divided into a plurality of blocks each corresponding to a plurality of the addresses, a write address decoding circuit that decodes a write address specifying a block to write data, a write buffer provided in a write signal path to input write data including write address to the block specified by the write address and a write buffer control unit that disables a write buffer provided in the write signal path for inputting the write data to blocks other than a block including a write address decoded by the write address decoding circuit.

DETAILED DESCRIPTION OF THE EMBODIMENTS

In an exemplary semiconductor storage device and a control method of the semiconductor storage device which are disclosed herein, transfer buffers that are provided in write signal paths for inputting write data to blocks other than a block including a decoded address are controlled to be in a disable state. Transfer buffers provided in read signal paths for outputting read data from blocks other than a block including a decoded address may also be controlled to be in the disable state.

By controlling as many transfer buffers as possible that are not directly related to writing or reading of data to the disable state, the power consumption of the semiconductor storage device can be reduced. In addition, further reduction of power consumption can be achieved by supplying a clock signal only to a storage element specified by a decoded address.

Figure 1:
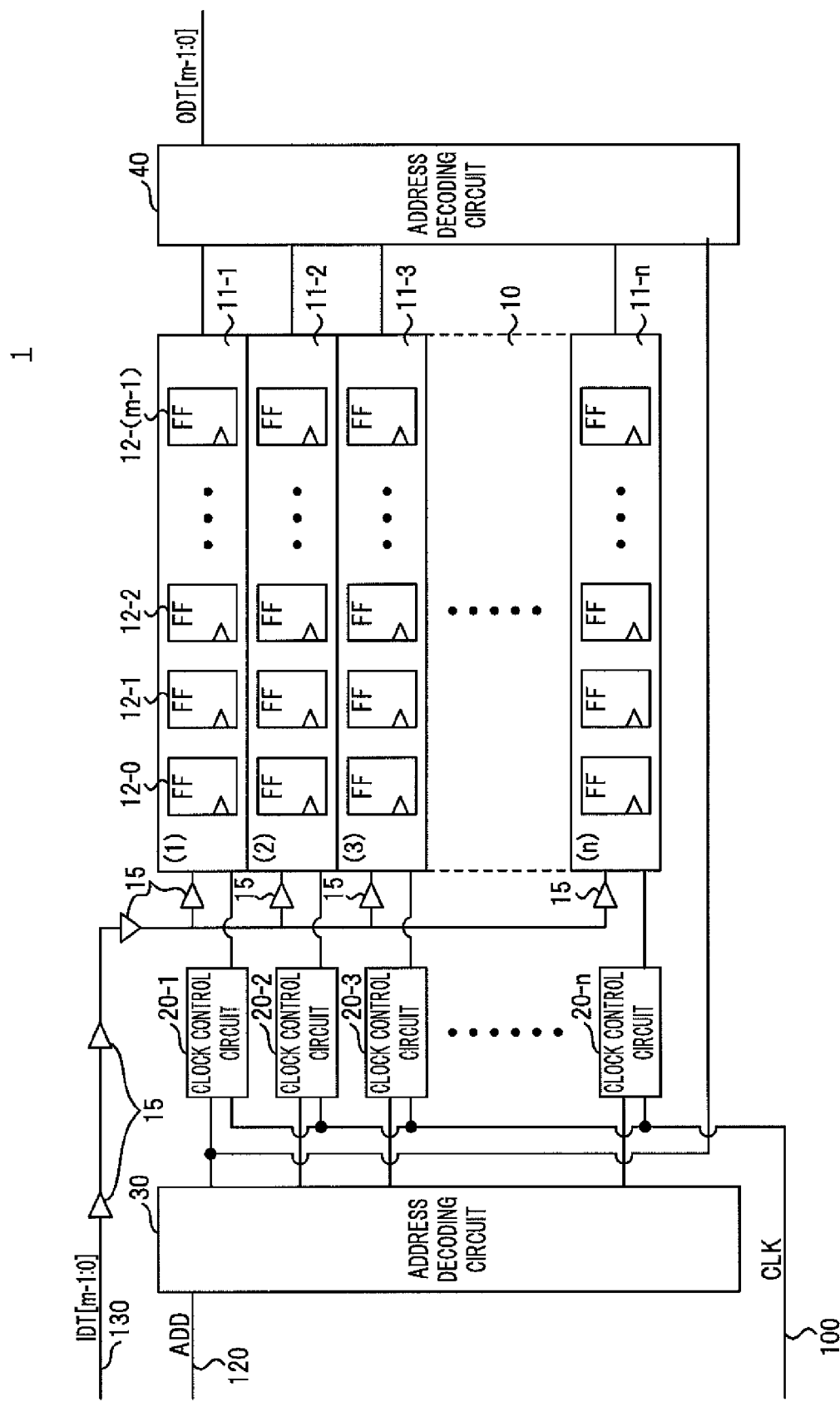
FIG. 1 illustrates an exemplary of a conventional semiconductor storage device.
Figure 2:
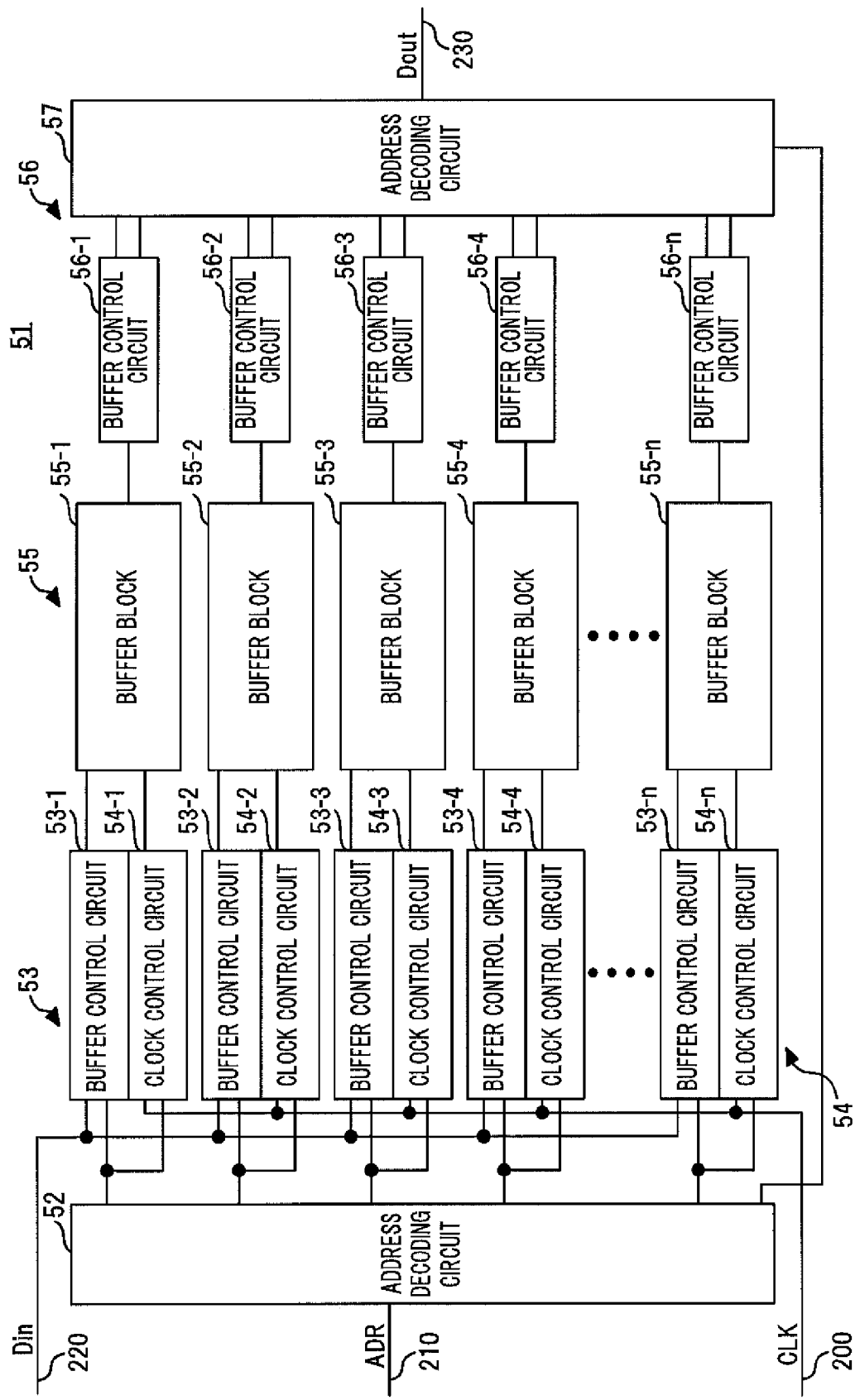
FIG. 2 illustrates an exemplary semiconductor storage device according to an embodiment of the present invention.

FIG. 2 illustrates an exemplary semiconductor storage device according to an exemplary embodiment. A semiconductor storage device 51 includes an address decoding circuit 52, a buffer control unit 53, a clock control unit 54, a storage unit 55, a buffer control unit 56, and an address decoding circuit 57. FIG. 2 illustrates write data to be input 220, read data to be output 230, a write address signal to be input or a read address signal 210, and a clock signal 200.

The address decoding circuit 52 decodes a write address signal into a write address. The buffer control unit 53 includes n (n is a natural number equal to or greater than 2) buffer control circuits 53-1 to 53-$n$. The clock control unit 54 includes n clock circuits 54-1 to 54-$n$. The storage unit 55 includes n buffer blocks 55-1 to 55-$n$ each corresponding to a plurality of addresses. Each of the buffer blocks 55-1 to 55-$n$ includes a plurality of storage elements. The storage elements may be composed of memory elements, latch elements, or the like. When m-bit data (m is a natural number) is stored at an address, the storage elements are composed of m-stage flip-flops or the like. The buffer control unit 56 includes n buffer control circuits 56-1 to 56-$n$. The address decoding circuit 57 selects data to be read out based on a read address signal.

Write signal paths include a plurality of transfer buffers and input write data to blocks including the individual addresses of the storage unit 55. The buffer control unit 53 executes control so that transfer buffers that are provided in write signal paths for inputting write data to buffer blocks other than a buffer block including an address decoded by the address decoding circuit 52 are brought to a disable state.

Read signal paths a plurality of transfer buffers and output read data from storage elements corresponding to the individual addresses of the storage unit 55. The buffer control unit 56 executes control so that transfer buffers that are provided in read signal paths for outputting read data from buffer blocks other than a buffer block including an address decoded by the address decoding circuit 57 are brought to the disable state.

The clock control unit 54 suppresses or inhibits input of a clock signal 200 input to storage elements corresponding to addresses other than an address decoded by the address decoding circuit 52. A clock control unit 54 may be a clock control circuit having a configuration disclosed in Japanese Laid-open Patent Publication No. 2007-149201.

Figure 3:
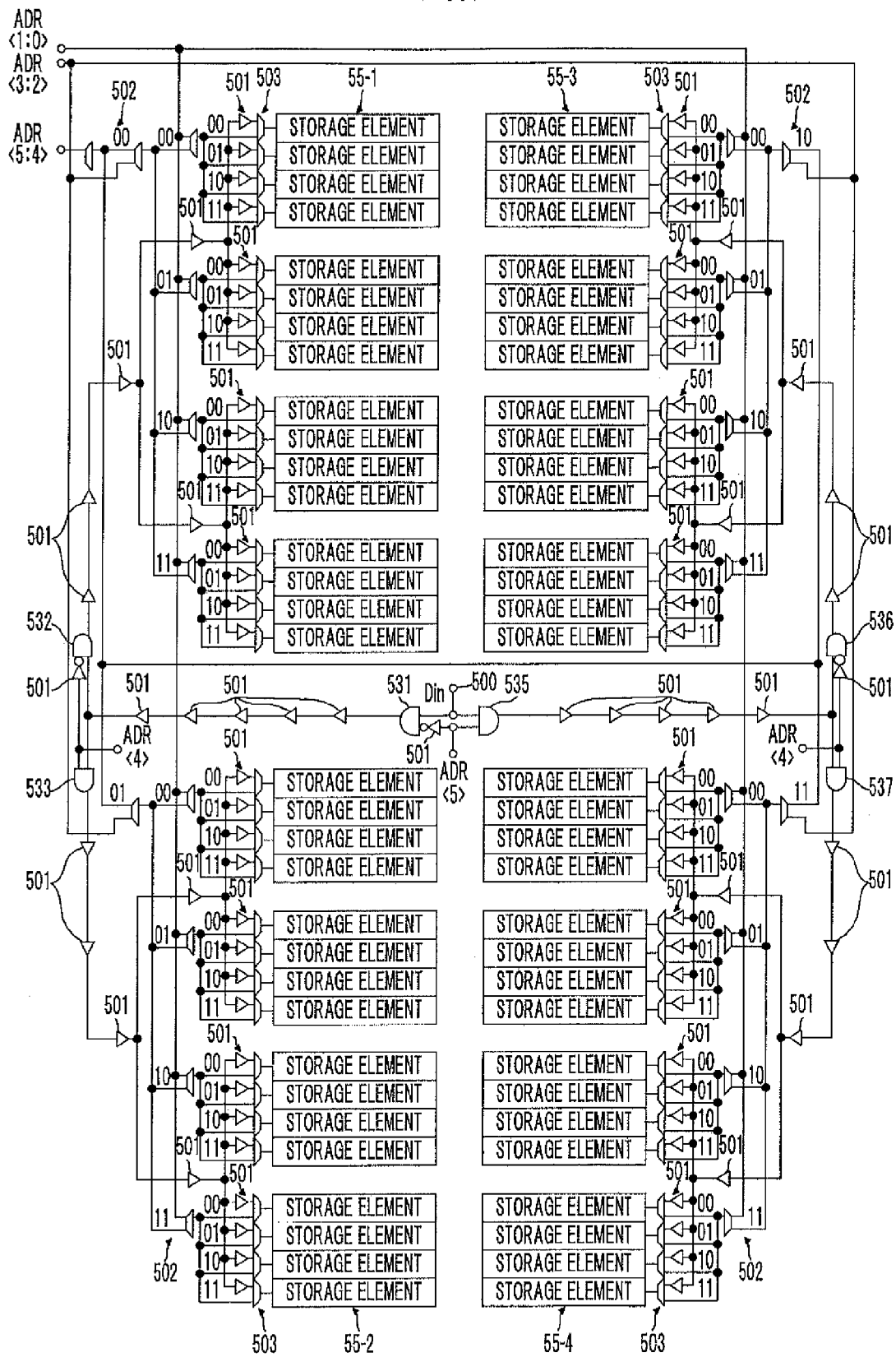
FIG. 3 illustrates an exemplary semiconductor storage device.

FIG. 3 illustrates a part of a semiconductor storage device, for example semiconductor storage device 51 illustrated in FIG. 2. FIG. 3 illustrates the buffer control circuits 53-1 to 53-4, the buffer blocks 55-1 to 55-4, write signal paths for inputting write data to the buffer blocks 55-1 to 55-4, and transfer buffers 501 provided in these write signal paths. Transfer buffers related to the buffer control circuit 53-1 are designated by reference numeral 501.

In addition, a clock signal is not illustrated in FIG. 3. FIG. 3 illustrates each of the buffer blocks 55-1 to 55-4 divided so as to include sixteen addresses. However, the number of addresses included in each of the buffer blocks 55-1 to 55-4 is not limited to sixteen, and thus the number of bits of an address signal is not limited to the one depicted in FIG. 3.

In FIG. 3, the write signal paths extend from an input terminal 500 of the write data 220, through the address decoding circuit 52 and the buffer control unit 53, to the storage unit 55 (individual buffer blocks 55-1 to 55-4). A plurality of transfer buffers 501 may be provided in the write signal paths. The address decoding circuit 52 includes a plurality of decoders 502, a plurality of transfer buffers 501, and a plurality of selectors 503. The buffer control unit 53 includes a plurality of AND gates. In the example illustrated in FIG. 3, the first buffer control circuit (53-1 in FIG. 2) includes AND gates 531 and 532, and the second buffer control circuit (53-2 in FIG. 2) includes AND gates 531 and 533. Thus, the AND gate 531 is shared by the first buffer control circuits (53-1 in FIG. 2) and the second buffer control circuit (53-2 in FIG. 2). The third buffer control circuit (53-3 in FIG. 2) includes AND gates 535 and 536, and the fourth buffer control circuit (53-4 in FIG. 2) includes AND gates 535 and 537. Thus, the AND gate 535 is shared by the third buffer control circuits (53-3 in FIG. 2) and the fourth buffer control circuit (53-4 in FIG. 2).

According to an exemplary embodiment, first buffer control circuits 53-1 to the fourth buffer control circuits 53-4 in FIG. 2 are not necessarily configured as illustrated in FIG. 3 and may be configured using a logic gate other than an AND gate. The buffer control unit 53, e.g., the first buffer control circuits 53-1 to the n-th buffer control circuits 53-$n$ may have any configuration that performs control so that the transfer buffers 501 in the write signal paths for inputting the write data 220$n$ to buffer blocks other than a buffer block including an address decoded by the address decoding circuit 52 are brought to the disable state.

Figure 4:
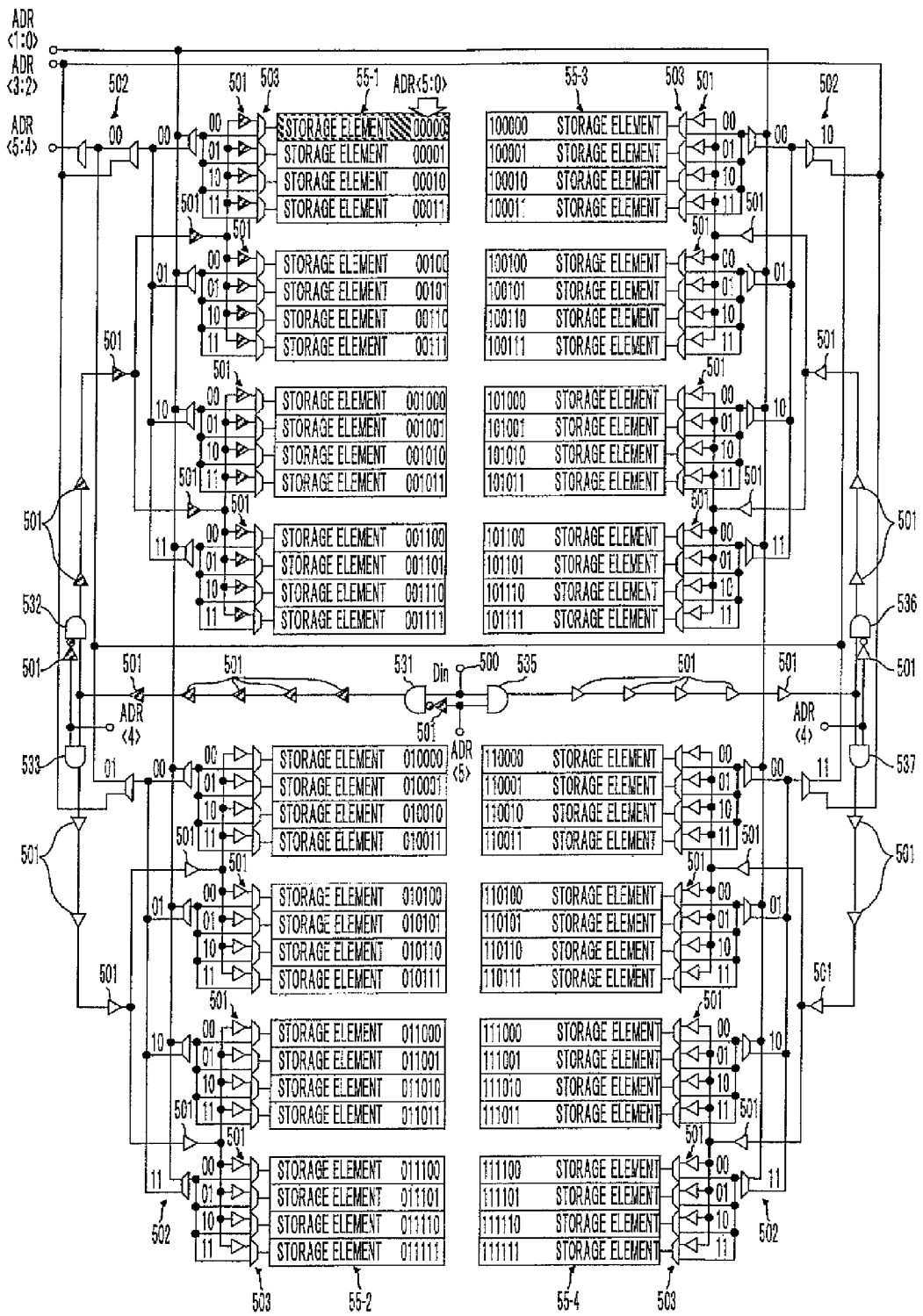
FIG. 4 illustrates exemplary transfer buffers operating based on selection of an arbitrary address.

FIG. 4 illustrates the transfer buffers 501, for example in FIG. 3, which operate in accordance with selection of an arbitrary address. In FIG. 4, the transfer buffers 501 which are in an enable state are indicated by hatching, the transfer buffers 501 which are in a disable state are indicated without hatching.

As an example, data 220 being written at a write address in the buffer block 55-1 may be specified by an address signal ADR[5:0]=6'b000000. In this case, the ADR[5:4] which is a part of the address signal ADR may be decoded by the address decoding circuit 52 and input to the buffer block 55-1. Under the control of the first buffer control circuit (53-1 in FIG. 2), the data 220 may be input to the buffer block 55-1 via the AND gates 531 and 532 and the transfer buffers 501 in the enable state as indicated by hatching in FIG. 4.

Thus, the data 220 is written at the write address in the buffer block 55-1 specified by the address signal ADR[5:0]. While the data 220 is written at an address in the buffer block 55-1, the transfer buffers 501 in the write signal paths that extend to the buffer blocks 55-2 to 55-4, to which the data 220 is not to be written, are controlled to be in the disable state.

Therefore, the number of the transfer buffers 501 in the enable state can be reduced to one-fourth the original number, compared to a case where the transfer buffers 501 in the write signal paths that extend to all of the buffer blocks 55-1 to 55-4 are controlled to be in the enable state. As a result, reduction of power consumption equivalent to the reduction can be achieved. Thus, the effect produced by an exemplary embodiment that reduces power consumption of the entire semiconductor storage device 51 increases with increasing number n of the buffer blocks 55-1 to 55-$n$ in the storage unit 55.

In FIG. 3 and FIG. 4, buffer control unit 56, read signal paths for outputting read data, and transfer buffers in the read signal paths are not illustrated. Buffer control unit 56, similarly to the buffer control unit 53 that performs control so that transfer buffers provided in write signal paths for inputting write data to buffer blocks other than a buffer block including an address decoded by the address decoding circuit 52 are brought to the disable state, performs control so that transfer buffers provided in read signal paths for outputting read data from buffer blocks other than a buffer block including an address selected by the address decoding circuit 57 are brought to the disable state.

Transfer buffers provided in write signal path and transfer buffers provided in read signal paths may be controlled to be in the disable state in accordance with a specified address. However, such control operations for causing transfer buffers to be in the disable state may be performed on either transfer buffers in write signal paths or transfer buffers in read signal paths. The number of transfer buffers increases with increasing number n of the buffer blocks 55-1 to 55-$n$ in the storage unit 55. Thus, effects of reduction of power consumption of the entire semiconductor storage device 51 can be achieved even when only either transfer buffers in write signal paths or transfer buffers in read signal paths are controlled to be in the disable state.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on non-transitory computer-readable media comprising computer-readable recording media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor storage device comprising:
   a storage unit including a plurality of storage elements specified by addresses and divided into a plurality of blocks each corresponding to a plurality of the addresses;
   a write address decoding circuit that decodes a write address specifying a block to write data;
   a write buffer provided in a write signal path to input write data including write address to the block specified by the write address;
   a write buffer control unit that disables a write buffer provided in the write signal path for inputting the write data to blocks other than a block including a write address decoded by the write address decoding circuit; and
   a clock control unit that inhibits input of a clock signal to storage elements included in a block specified by an address other than the address decoded by the write address decoding circuit.

2. The semiconductor storage device of claim 1,
   wherein the write buffer control unit includes buffer control circuits that disables the write buffer in the write signal path based on a part of the write address decoded by the write address decoding circuit.

3. The semiconductor storage device of claim 1, further comprising:
   a read address decoding circuit that decodes a read address specifying a block to read data from;
   a read buffer provided in a read signal path to output read data from the block specified by the read address; and
   a read buffer control unit that disables a read buffer provided in the read signal path for outputting the read data from blocks other than a block including a read address decoded by the read address decoding circuit.

4. A semiconductor storage device comprising:
   a storage unit including a plurality of storage elements specified by addresses and divided into a plurality of blocks each corresponding to a plurality of the addresses;
   a read address decoding circuit that decodes a read address specifying a block to read data from;
   a read buffer provided in a read signal path to output read data from the blocks specified by the read address;
   a read buffer control unit that disables a read buffer provided in the read signal path for outputting the read data from blocks other than a block including a read address decoded by the read address decoding circuit and
   a clock control unit that inhibits input of a clock signal to storage elements included in a block specified by an address other than the address decoded by the read address decoding circuit.

5. A method for controlling a semiconductor storage device including a storage unit including a plurality of storage elements specified by addresses and divided into a plurality of blocks each corresponding to a plurality of the addresses, and a write buffer provided in a write signal path to input write data including write address to the block specified by the write address, the method comprising:
   decoding a write address specifying a block to write data;
   disabling a write buffer provided in the write signal path for inputting the write data to blocks other than a block including a write address decoded by the decoding of the write address; and
   inhibiting input of a clock signal to storage elements included in a block specified by an address other than the write address decoded by the decoding of the write address.

6. The method of claim 5, further comprising:
   decoding a read address specifying a block to read data from; and
   disabling a read buffer provided in the read signal path for outputting the read data from blocks other than a block including a read address decoded by the decoding of the read address.

7. The method of claim 5, wherein in the disabling, the write signal path is disabled based on a part of the write address decoded by the decoding of the write address.

8. A method for controlling a semiconductor storage device including a storage unit including a plurality of storage elements specified by addresses and divided into a plurality of blocks each corresponding to a plurality of the addresses, and a read buffer provided in a read signal path to output read data from the block specified by the read address, the method comprising:
   decoding a read address specifying a block to read data;
   disabling a read buffer provided in the read signal path for outputting the read data from blocks other than a block including a read address decoded by the decoding of the read address; and
   inhibiting input of a clock signal to storage elements included in a block specified by an address other than the read address decoded by the decoding of the read address.

9. A device comprising:
   a storage unit divided into a plurality of blocks;
   a decoding circuit that decodes an address specifying a block of the plurality of blocks;
   a buffer provided in a signal path to input data to the specified block;
   a control unit that disables a buffer for inputting data to blocks of the plurality of blocks other than the specified block; and
   a clock control unit that inhibits input of a clock signal to a block specified by an address other than the address decoded by the decoding circuit.

10. A method for controlling a device, comprising:
    decoding an address specifying a block of a plurality of blocks;
    disabling a buffer for inputting data to blocks of the plurality of blocks other than the specified block; and
    inhibiting input of a clock signal to a block specified by an address other than the address decoded by the decoding of the address.

* * * * *